(12) United States Patent
Tokida

(10) Patent No.: US 7,535,727 B2
(45) Date of Patent: May 19, 2009

(54) LIGHT SOURCE MODULE

(75) Inventor: Tsukasa Tokida, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 11/656,525

(22) Filed: Jan. 23, 2007

(65) Prior Publication Data

US 2007/0171662 A1 Jul. 26, 2007

(30) Foreign Application Priority Data

Jan. 23, 2006 (JP) ............................. 2006-013696

(51) Int. Cl.
H05K 7/00 (2006.01)
(52) U.S. Cl. ................. 361/760; 361/704; 361/719; 361/720; 174/255; 257/678; 257/713; 257/724
(58) Field of Classification Search ................. 361/760, 361/704, 719, 720; 174/255; 257/678, 713, 257/724, E23.086
See application file for complete search history.

(56) References Cited

U.S. PATENT DOCUMENTS

| 5,316,489 | A | * | 5/1994 | Kachlic et al. | ................. | 439/79 |
| 5,606,358 | A | * | 2/1997 | Beaman | ................. | 347/237 |
| 5,847,512 | A | * | 12/1998 | Baba et al. | ................. | 315/51 |
| 5,917,701 | A | * | 6/1999 | Solberg | ................. | 361/704 |
| 6,011,233 | A | * | 1/2000 | Hwang et al. | ................. | 219/91.21 |
| 6,220,764 | B1 | * | 4/2001 | Kato et al. | ................. | 385/92 |
| 6,646,881 | B1 | * | 11/2003 | Lai et al. | ................. | 361/719 |
| 2002/0024395 | A1 | * | 2/2002 | Akatsuka et al. | ................. | 331/74 |
| 2002/0171135 | A1 | * | 11/2002 | Yoshida et al. | ................. | 257/678 |
| 2003/0178226 | A1 | * | 9/2003 | Liu | ................. | 174/252 |
| 2004/0066630 | A1 | * | 4/2004 | Whittenburg et al. | ................. | 361/719 |
| 2004/0196877 | A1 | * | 10/2004 | Kawakami et al. | ................. | 372/23 |
| 2004/0252501 | A1 | * | 12/2004 | Moriyama et al. | ................. | 362/238 |
| 2005/0007783 | A1 | * | 1/2005 | Ono | ................. | 362/294 |
| 2005/0039551 | A1 | * | 2/2005 | Shute et al. | ................. | 73/866.5 |
| 2005/0135093 | A1 | * | 6/2005 | Alexanderson et al. | ................. | 362/227 |
| 2005/0163938 | A1 | * | 7/2005 | Yamazaki et al. | ................. | 427/554 |
| 2006/0126303 | A1 | * | 6/2006 | Wang et al. | ................. | 361/704 |
| 2006/0197444 | A1 | * | 9/2006 | Takeda et al. | ................. | 313/512 |
| 2006/0258055 | A1 | * | 11/2006 | Okamoto | ................. | 438/124 |
| 2006/0288968 | A1 | * | 12/2006 | Damian et al. | ................. | 123/41.15 |
| 2007/0064450 | A1 | * | 3/2007 | Chiba et al. | ................. | 362/655 |
| 2007/0109806 | A1 | * | 5/2007 | Tsukamoto et al. | ................. | 362/545 |
| 2007/0171662 | A1 | * | 7/2007 | Tokida | ................. | 362/459 |
| 2007/0206369 | A1 | * | 9/2007 | Takeda et al. | ................. | 361/820 |

FOREIGN PATENT DOCUMENTS

JP 2005-44777 A 2/2005

* cited by examiner

Primary Examiner—Tuan T Dinh
Assistant Examiner—Xiaoliang Chen
(74) Attorney, Agent, or Firm—Sughrue Mion, PLLC

(57) ABSTRACT

A light source module includes a circuit board on which a predetermined conductive pattern is formed, a semiconductor light emitting element mounted on the circuit board, and a plurality of power supplying terminals to which power cords for supplying electric power to the semiconductor light emitting element are connected. An entire lower face of the circuit board is electrically insulated, and the plurality of power supplying terminals is fixed onto the conductive pattern on the circuit board. The plurality of power supplying terminals protrudes from the circuit board.

8 Claims, 5 Drawing Sheets

LIGHT SOURCE MODULE

The present invention claims priority from Japanese patent application no. 2006-013696 filed on Jan. 23, 2006, the entire content of which is incorporated herein by reference.

BACKGROUND OF INVENTION

1. Field of the Invention

The present invention relates to a light source module. More specifically, the present invention relates to a technical field for reducing the number of parts by fixing power supplying terminals, to which power source cords are connected, onto a circuit board.

2. Description of the Related Art

There is a light source module in which a semiconductor light emitting element, such as a light emitting diode (LED), is used as a light source. Such a light source module is employed, for example, in a vehicle lamp in which a light emitted from a light source is irradiated through a projection lens as an illuminating light.

In such a vehicle lamp, for example, a light emitting diode is mounted on a conductive pattern formed on a circuit board. The circuit board is attached to an attachment, and the attachment is attached to a heat radiating body such as a bracket. The attachment is provided with a lead which is to be connected to the conductive pattern on the circuit board, and the lead is connected to a power source supplying terminal arranged at an outer face of the attachment. When a connector provided at a tip portion of a power source cord is connected to the power source supplying terminal, electricity is supplied to the light emitting diode via the power source cord, the power source supplying terminal, the lead, and the conductive pattern.

However, according to the above light source module, the circuit board is attached to the attachment, and then the attachment is attached to the heat radiating body. Therefore, an assembling work is complicated and inefficient. Further, since the attachment is arranged in this way, a number of parts are required, and a manufacturing cost is high.

SUMMARY OF INVENTION

It is an object of the present invention to provide a light source module in which the number of parts is reduced.

According to an aspect of the invention, a light source module includes a circuit board on which a predetermined conductive pattern is formed, a semiconductor light emitting element mounted on the circuit board, and a plurality of power supplying terminals to which power cords for supplying electric power to the semiconductor light emitting element are connected. An entire lower face of the circuit board is electrically insulated, and the plurality of power supplying terminals is fixed onto the conductive pattern on the circuit board. The plurality of power supplying terminals protrudes from the circuit board.

DESCRIPTION OF EXEMPLARY EMBODIMENT

Hereinafter, exemplary embodiments of the invention will be explained with reference to the drawings. The following exemplary embodiments do not limit the scope of the invention.

Figure 1:
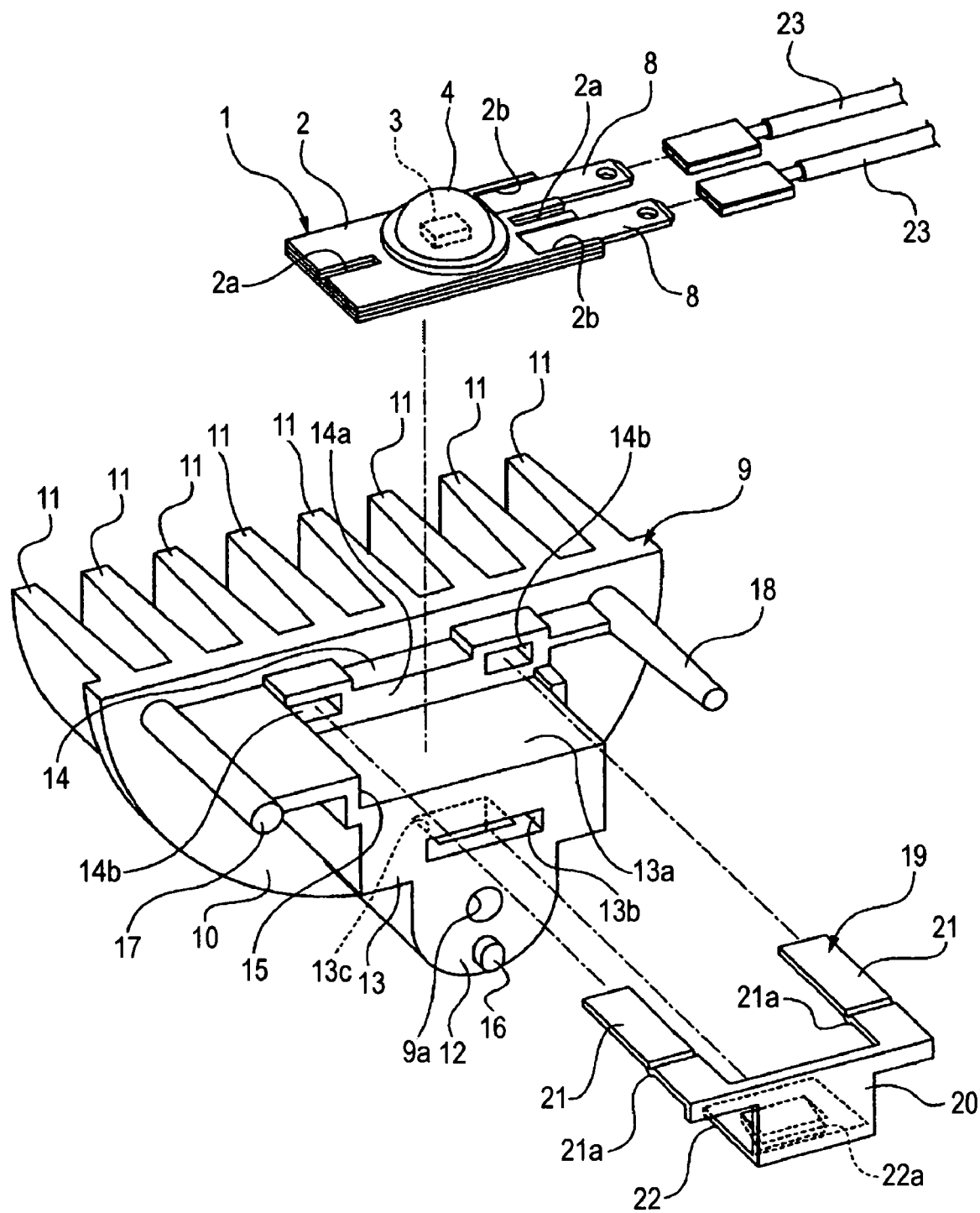
FIG. 1 is an exploded perspective view showing a light source unit including a light source module, a heat radiating body and a clip.
Figure 2:
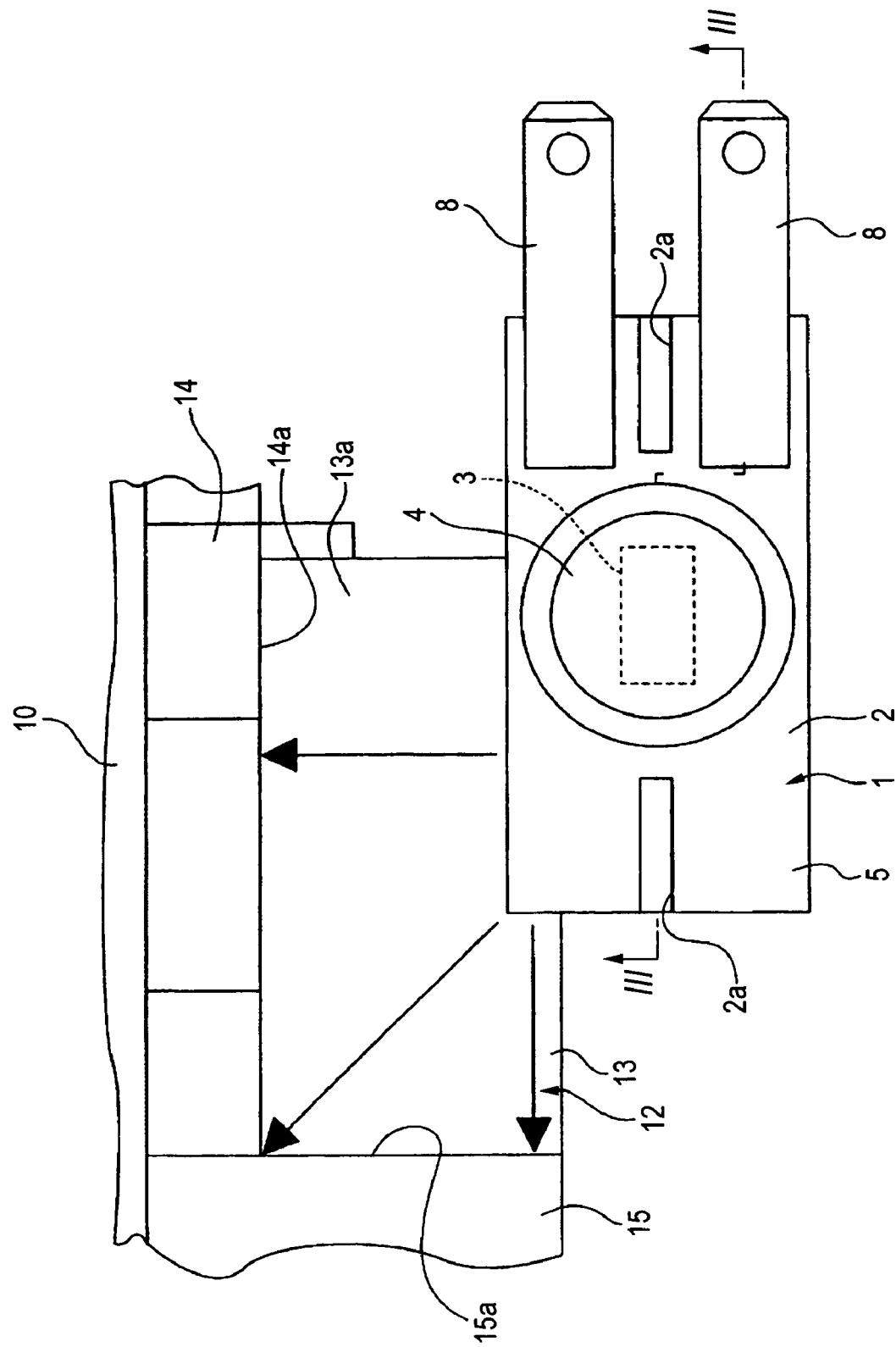
FIG. 2 is an enlarged plan view showing a positional relation between the light source module and the heat radiating body.
Figure 3:
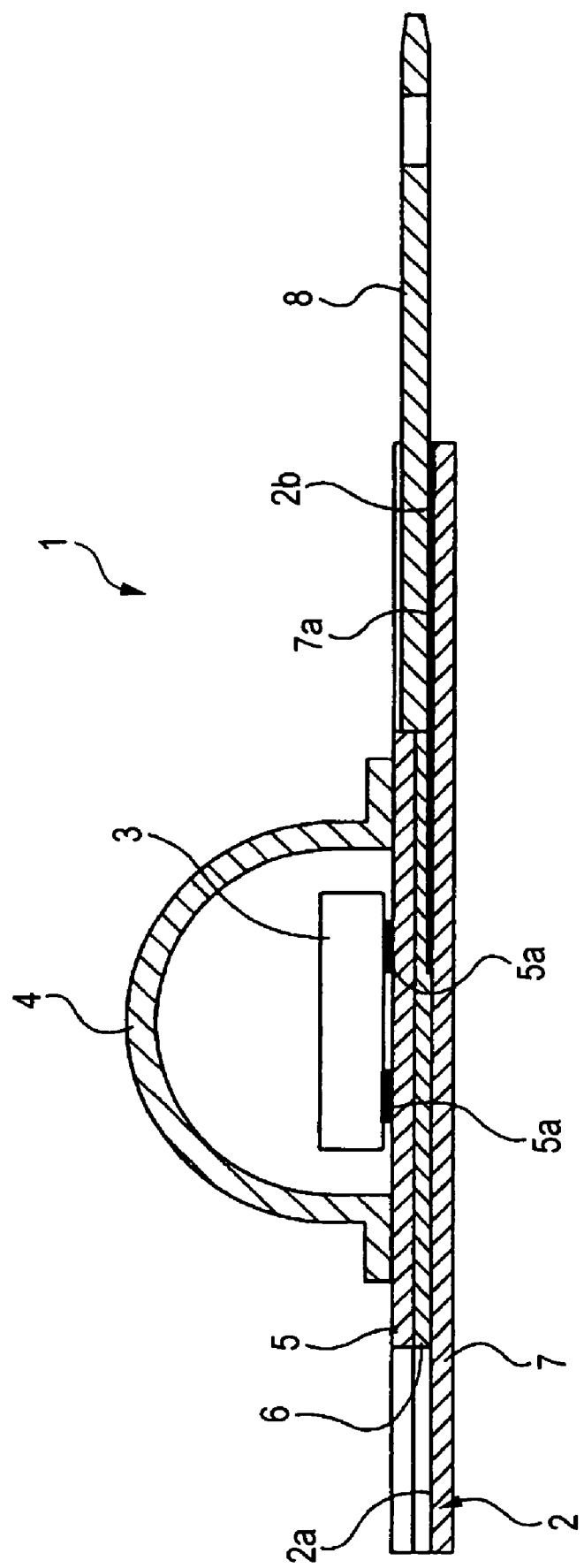
FIG. 3 is a sectional view taken on line a III-III in FIG. 2.

As shown in FIGS. 1 to 3, a light source module 1 includes a circuit board 2, a semiconductor light emitting element 3 such as an LED (light emitting diode) chip, and a cover 4.

The circuit board 2 may be a rectangular multiple layer board having three layers of substrates that are laminated. The substrates are respectively provided as non-electric conductive layers 5, 6, 7 having no electric conductivity (see FIG. 3). Although the non-electric conductive layers 5, 6, 7 have no electric conductivity, they are made of material having high heat conductivity. The non-electric conductive layers 5, 6, 7 may be a ceramic substrate (such as a nitride aluminum substrate, an alumina substrate, a mullite substrate and a glass ceramic substrate), or a glass epoxy substrate.

A pair of electric conductive patterns 5a, 5a is formed on a central portion of the non-electric conductive layer 5 that is located at an upper layer part. The pair of electric conductive patterns 5a, 5a is made of a metallic material such as gold or copper, and the electric conductive patterns 5a, 5a are formed so as to be separated from each other in a longitudinal direction of the non-electric conductive layer 5.

A pair of electric conductive patterns 7a, 7a is formed on the non-electric conductive layer 7 that is located at a lower layer part. The pair of electric conductive patterns 7a, 7a is formed on one side in the longitudinal direction of the non-electric conductive layer 7. The pair of electric conductive patterns 7a, 7a is made of a metallic material such as gold or copper. In FIG. 3, only one electric conductive pattern 7a is shown.

Vias (not shown) are respectively provided through the non-electric conductive layers 5, 6 that are located at the upper layer part and a intermediate layer part. The conductive patterns 5a, 5a formed on the non-electric conductive layer 5 are respectively connected to the conductive patterns 7a, 7a formed on the non-electric conductive layer 7 through the vias provided through the non-electric conductive layers 5, 6. A thickness of each of the conductive patterns 7a, 7a may be 30 μm or more.

As the semiconductor light emitting element 3, a light emitting diode on which a fluorescent material film is uniformly coated may be used. A lower face of the semiconductor light emitting element 3 is joined onto the conductive patterns 5a, 5a, extending over the conductive patterns 5a, 5a, whereby the semiconductor light emitting element 3 is electrically connected to the conductive patterns 7a, 7a through the vias formed through the non-electric conductive layers 5, 6.

The cover 4 is joined onto an upper face of the non-electric conductive layer 5 so as to cover the semiconductor light emitting element 3. An outer face of the cover 4 is formed substantially in a hemisphere shape, whereby the semiconductor light emitting element 3 is arranged in a hollow hermetically-closed region inside the cover 4.

As shown in FIGS. 1 and 3, engagement recess portions 2a, 2a that are opened upward are formed at central portions of respective longitudinal end portions of the circuit board 2.

The engagement recess portions 2a, 2a are formed so as to be long in the longitudinal direction of the circuit board 2. The engagement recess portions 2a, 2a may be formed by cutting out the corresponding portions of the non-electric conductive layers 5, 6.

Fixing recess portions 2b, 2b that are opened upward are formed on one longitudinal end portion of the circuit board 2, interposing one of the engagement recess portions 2a therebetween. The fixing recess portions 2b, 2b may be formed by cutting out the corresponding portions of the non-electric conductive layers 5, 6. By forming the fixing recess portions 2b, 2b, the conductive patterns 7a, 7a, formed on the non-electric conductive layer 7 become exposed (see FIG. 3).

As shown in FIGS. 1 to 3, power supplying terminals 8, 8 are respectively placed and fixed at the fixing recess portions 2b, 2b on the circuit board 2. Each of the power supplying terminals 8, 8 are formed in a rectangular flat plate shape. As shown in FIG. 3, a thickness of each of the power supplying terminals 8, 8 is smaller than a depth of the respective fixing recess portions 2b, 2b. Accordingly, when the power supplying terminals 8, 8 are placed and fixed at the fixing recess portions 2b, 2b, an upper face of each power supplying terminals 8, 8 is located at a position that is lower than an upper face of the circuit board 2. A part of each power supplying terminal 8, 8 is placed on the respective fixing recess portion 2b, 2b, and is connected to the respective conductive pattern 7a, 7a by means such as welding. The other part of each power supplying terminal 8, 8 that is not placed on the respective fixing recess portions 2b, 2b protrudes to the side.

By fixing the power supplying terminals 8, 8 onto the conductive patterns 7a, 7a by means of welding as described above, the fixing work can be quickly performed and the working property can be enhanced. When performing a welding, in general, it is necessary that a thickness of the conductive pattern 7a, 7a is not less than 30 μm. In the case of the light source module 1, as described above, the thickness of the conductive pattern 7a, 7a is formed to be 30 μm or more.

As shown in FIGS. 1 and 2, the light source module 1 is attached to the heat radiating body 9. The heat radiating body 9 may be fixed to a bracket arranged inside a lighting chamber of a vehicle lamp (which will be described later).

The heat radiating body 9 may be made of a material having high heat conductivity such as a metallic material, and respective parts thereof are formed integrally together. As shown in FIG. 1, the heat radiating body 9 includes a base plate portion 10, heat radiating fins 11 each protruding backward from the base plate portion 10, and an attaching protrusion 12 protruding forward from the base plate portion 10.

The base plate portion 10 is formed in a flat plate shape facing front and rear directions.

The heat radiating fins 11 are arranged in a right and left direction at regular intervals.

The attaching protrusion 12 includes a base block 13, a first positioning protrusion 14 protruding upward from a rear end portion of the base block 13, and a second positioning protrusion 15 protruding upward from a right end portion of the base block 13.

An upper face of the base block 13 is formed in a rectangular flat plane shape, and is formed as a heat absorbing face 13a. A size of the heat absorbing face 13a is a little larger than that of the circuit board 2. A first insertion hole 13b is formed on a front face of the base block 13. Inside the first insertion hole 13b, an engaging hole 13c that is opened upward is formed. At a lower end portion on the front face of the base block 13, a lamp positioning portion 16 that protrudes forward is provided.

A screw inserting hole 9a is formed above the lamp positioning portion 16, penetrating through the heat radiating body 9 in a front and rear direction.

Second insertion holes 14b, 14b are formed on the front face 14a of the first positioning portion 14. The second insertion holes 14b, 14b are opened forward, and are separated from each other in the right and left direction.

The second positioning portion 15 is formed so as to extend in the front and rear direction. As shown in FIG. 2, a left side face 15a of the second positioning portion 15 is perpendicular to the front face 14a of the first positioning protrusion 14.

Lamp positioning portions 17, 18 are respectively provided on the right and left portions of the base block 13, each protruding forward from the base plate portion 10.

The light source module 1 is fixed to the heat radiating body 9 by a clip 19.

The clip 19 is integrally formed from an elastic plate member made of a metallic material. The clip 19 includes a connecting portion 20 facing the front and rear directions, holding protrusions 21, 21 each protruding backward from an upper edge of the connecting portion 20, and an inserting protrusion 22 protruding backward from a lower edge of the connecting portion 20.

Each of the holding protrusions 21, 21 protrudes backward from right and left edge portions of the connecting portion 20. The respective holding protrusions 21, 21 have engaging protrusions 21a, 21a protruding downward at an intermediate portion in the protruding direction. The engaging protrusions 21a, 21a extend in the right and left direction.

An engaging protruding piece 22a is formed on the inserting protruding portion 22 by forming a cut on the inserting protruding portion 22 and flipping the cut portion such that the engaging protruding piece 22a protrudes obliquely downward to the front side.

Explanations will be made in connection with a procedure of fixing the light source module 1 to the heat radiating body 9.

First, the circuit board 2 of the light source module 1 is positioned on the heat absorbing face 13a of the heat radiating body 9. As shown with arrows in FIG. 2, the light source module 1 is positioned with respect to the heat radiating body 9 such that a rear edge of the circuit board 2 is pushed to the front face 14a of the first positioning protrusion 14, and such that a right side edge of the circuit board 2 is pushed to the left side face 15a of the second positioning protrusion 15. When positioning is conducted in this way, the entire lower face of the circuit board 2 is in surface-contact with the heat absorbing face 13a of the heat radiating body 9.

Next, the respective holding protrusions 21, 21 of the clip 19 are inserted into the second insertion holes 14b, 14b of the heat radiating body 9 from the front side, and the inserting protrusion 22 of the clip 19 is inserted into the first insertion hole 13b of the heat radiating body 9 from the front side. When the holding protrusions 21, 21 and the inserting protrusions 22 are respectively inserted, the respective engaging protrusions 21a, 21a of the holding protrusions 21, 21 engage with the engagement recess portions 2a, 2a on the circuit board 2. Meanwhile, the engaging protruding piece 22a of the inserting protrusion 22 comes into slide-contact with a wall face (a lower face) inside the first insertion hole 13b and elastically deforms. When a front end of the engaging protruding piece 22a is located at an upper position of the engaging hole 13c, the engaging protruding piece 22a elastically returns to a non-deformed state and the front end thereof engages with the front side open edge of the engaging hole 13c. Accordingly, the clip 19 is attached to the heat radiating body 9.

In a state in which the clip 19 is attached to the heat radiating body 9 as described above, a biasing force is generated by elasticity of the holding protrusions 21, 21 and the inserting protrusion 22 in a direction in which the holding protrusions 21, 21 and the inserting protrusion 22 become close to each other. Accordingly, the circuit board 2 is pushed toward the heat absorbing face 13a side by the holding protrusions 21, 21, whereby the light source module 1 is fixed to the heat radiating body 9 (see FIG. 4).

As described above, the light source module 1 is fixed to the heat radiating body 9 by the elastic clip 19 made of metal, and the engaging protrusions 21a, 21a of the clip 19 engage with the engagement recess portions 2a, 2a of the circuit board 2. Therefore, a positioning of the clip 19 with respect to the light source module 1, as well as a positioning of the light source module 1 with respect to the heat radiating body 9 can be performed easily and quickly.

Further, since the engagement recess portion 2a of the circuit board 2 is formed between the power supplying terminals 8, 8, a space on the circuit board 2 can be effectively utilized, whereby the light source module 1 can be downsized, and each component can be stably fixed to each other without rattling when the light source module 1 is fixed to the heat radiating body 9.

Figure 4:
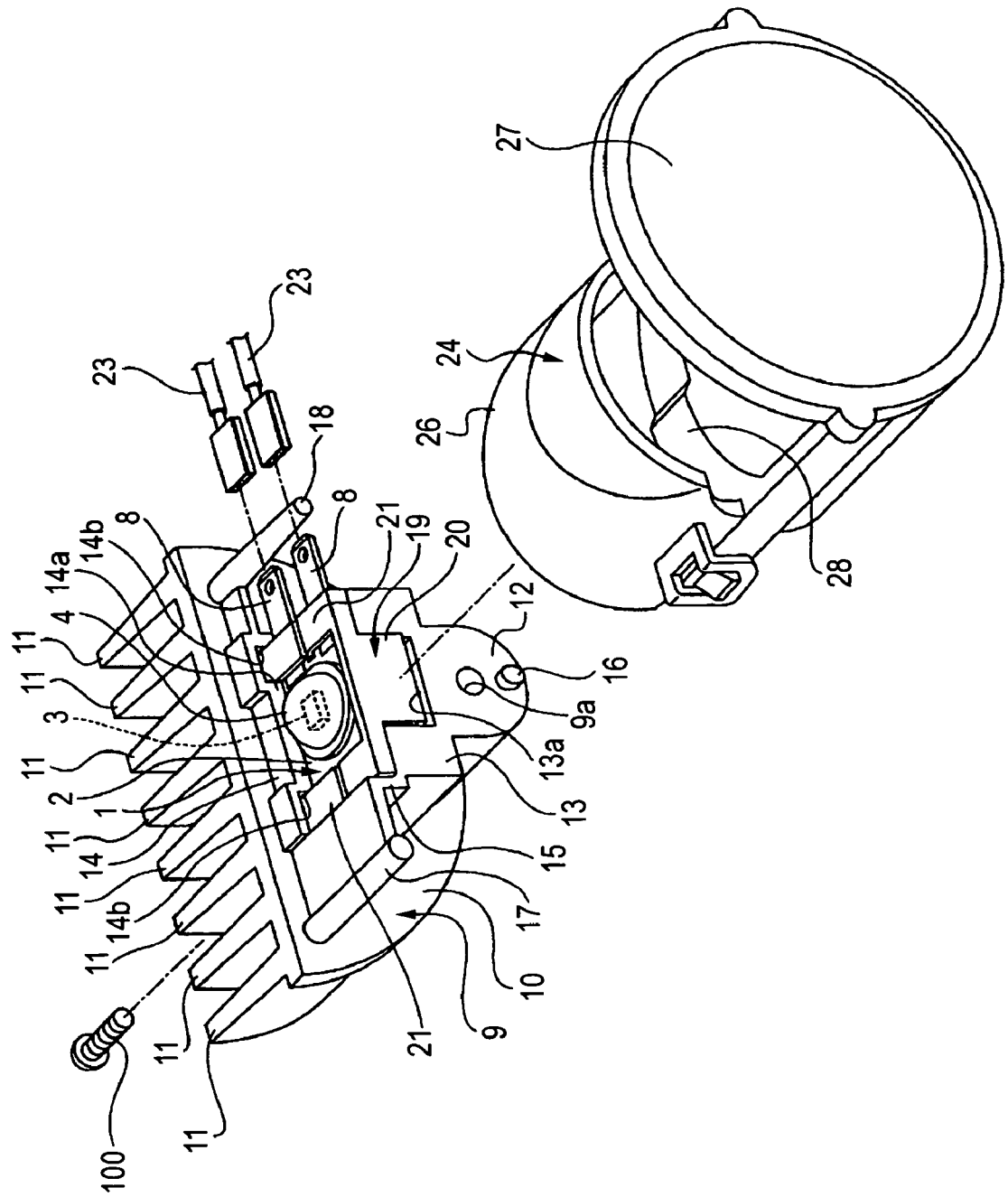
FIG. 4 is an exploded perspective view showing the light source unit and an optical component in which the light source module is fixed to the heat radiating body by a clip.

As shown in FIGS. 1 and 4, when the light source module 1 is fixed to the heat radiating body 9, power source cords 23, 23 connected to the power source circuit (not shown) are connected to the respective power supplying terminals 8, 8.

As shown in FIG. 4, an optical component 24 is arranged in front of the heat radiating body 9 when the light source module 1 is fixed to the heat radiating body 9 by the clip 19. The optical component 24 is positioned by the lamp positioning portions 16, 17, 18.

A screw hole (not shown) which opens to the rear side is formed on the optical component 24. The optical component 24 is fixed to the heat radiating body 9 by inserting a fastening screw 100 through the screw inserting hole 9a of the heat radiating body 9 from the rear side and screwing the fastening screw 100 to the screw hole.

According to the light source module 1 of the exemplary embodiment, the power supplying terminals 8, 8 are fixed onto the circuit board 2, and the power supplying terminals 8, 8 are directly connected to the power source cords 23, 23. Therefore, the light source module 1 can be directly fixed to the heat radiating body 9 without using an attachment. Accordingly, it is possible to reduce the number of parts, and to simplify the fixing work of the light source module 1 with respect to the heat radiating body 9.

When the light source module 1 is fixed to the heat radiating body 9, the entire lower face of the circuit board 2 comes into surface-contact with the heat absorbing face 13a. Accordingly, a large quantity of heat is radiated from the heat radiating fins 11, thereby ensuring an excellent heat radiating property.

According to the light source module 1 of the exemplary embodiment, the circuit board 2 is formed to have a multiple layer board, and the upper face of the circuit board 2 is located at a position that is higher than the upper faces of the power supplying terminals 8, 8. Accordingly, when the circuit board 2 is held by the clip 19, the holding protrusions 21, 21 of the clip 19 do not contact the power supplying terminals 8, 8. Consequently, a short circuit is prevented from being generated.

According to the light source module 1 of the exemplary embodiment, the circuit board 2 is formed in a rectangular shape, and the power supplying terminals 8, 8 protrude from one side edge of the circuit board 2. Therefore, the other side edge of the circuit board 2, from which the power supplying terminals 8, 8 are not protruded, can be used as a side edge for positioning the light source module 1 with respect to the heat radiating body 9. Accordingly, the light source module 1 can be easily positioned with respect to the heat radiating body 9.

Figure 5:
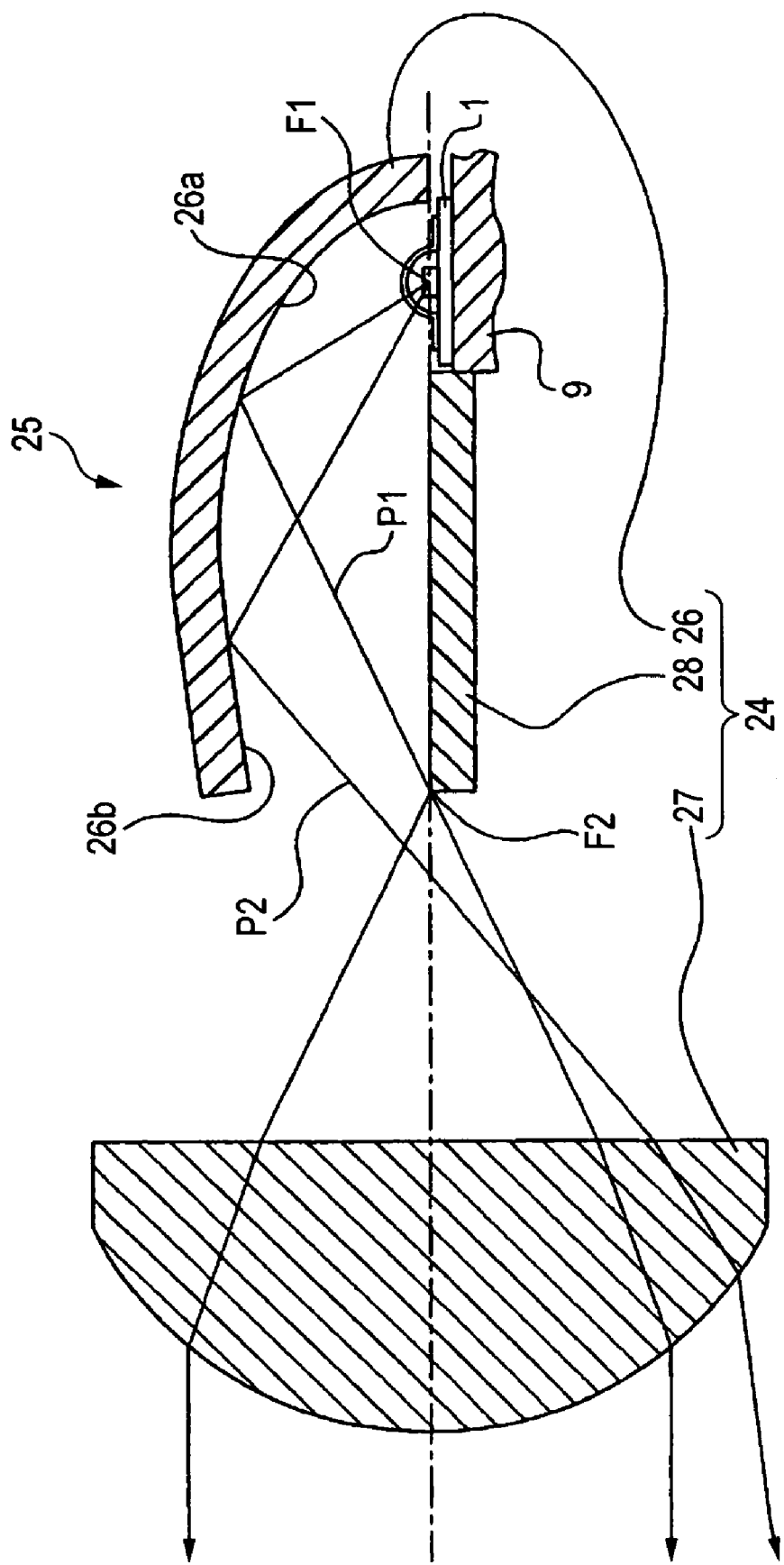
FIG. 5 is a sectional view of a vehicle lamp.

Next, an example of a vehicle lamp having the light source module 1 will be explained below with reference to FIG. 5.

A vehicle lamp 25 includes a reflector 26 inside which the light source module 1 is arranged, and a projection lens 27 which irradiates a light emitted from the semiconductor light emitting element 3. The reflector 26 and the projection lens 27 may be housed inside a lamp housing (not shown) formed by a lamp body and a transparent lens.

The vehicle lamp 25 may include only a single light source module 1 which is arranged inside a reflector 26 housed inside the lamp housing. Alternatively, the vehicle lamp 25 may include a plurality of light source modules 1 each arranged inside respective reflectors 26 housed inside the lamp housing. When the plurality of light source modules 1 are arranged, it is possible to enhance the luminance of the illumination light that is irradiated from the vehicle lamp 25 in accordance with the number of the light source modules 1. Further, since the degree of freedom of arranging the light source modules 1 is enhanced, the degree of freedom of designing a shape of the vehicle lamp 25 can be enhanced.

The reflector 26 includes a first reflecting surface 26a disposed at a rear side thereof, and a second reflecting surface 26b disposed in front of the first reflecting surface 26a. The first reflecting surface 26a is formed to have an elliptical spherical surface. The second reflecting surface 26b is formed to have an inclined face that gradually inclines downward towards a front side. The semiconductor light emitting element 3 of the light source module 1 is positioned at a first focal point F1 of the first reflecting surface 26a.

Inside the reflector 26, a flat-plate-shaped light control member 28 may be arranged, and the light source module 1 may be arranged at a rear side of the light control member 28.

As described above, the optical component 24 may include the reflector 26, the projection lens 27 and the light control member 28.

In such a case, a front end portion of the light control member 28 substantially coincides with a second focal point F2 of the first reflecting surface 26a of the reflector 26. A light that is emitted from the semiconductor light emitting element 3 and reflected by the first reflecting surface 26a (a light P1 shown in FIG. 5) is converged at the second focal point F2.

A focal point of the projection lens 27 coincides with the second focal point F2. Accordingly, the light emitted from the semiconductor light emitting element 3 and converged on the second focal point F2 is irradiated forward via the projection lens 27.

A light that is emitted from the semiconductor light emitting element 3 and reflected by the second reflecting surface 26b of the reflector 26 (a light P2 shown in FIG. 5) is directed to a front side of the second focal point F2 and transmits through a lower end portion of the projection lens 27. In this way, the light transmitting through the projection lens 27 is irradiated forward as an illumination light in which in which a main light flux reflected from the first reflecting surface 26a, and an auxiliary light flux reflected from the second reflecting surface 26b are combined.

While description has been made in connection with an exemplary embodiment of the present invention, it will be obvious to those skilled in the art that various changes and modification may be made therein without departing from the present invention. It is aimed, therefore, to cover in the appended claims all such changes and modifications falling within the true spirit and scope of the present invention.

What is claimed is:

1. A light source module comprising:
a circuit board on which a predetermined conductive pattern is formed, wherein at least a portion of the conductive pattern is formed on an uppermost surface of an uppermost layer of the circuit board;
a semiconductor light emitting element mechanically directly connected to the conductive pattern; and
a plurality of power supplying terminals to which power cords for supplying electric power to the semiconductor light emitting element are connected,
wherein the circuit board includes a top surface as the uppermost surface of the uppermost layer, a bottom surface opposite the top surface, and a plurality of side surfaces connecting the top and bottom surfaces, and the circuit board is formed in a rectangular shape,
wherein each of the power supplying terminals is formed in a flat plate shape having a thickness that is smaller than a thickness of the circuit board,
wherein the uppermost surface of the uppermost layer of the circuit board is positioned higher than an upper face of each of the power supplying terminals, and
wherein an entire lower face of the circuit board as the bottom surface is electrically insulated, the plurality of power supplying terminals is fixed onto the conductive pattern on the circuit board by welding, and the plurality of power supplying terminals protrudes from only one of the plurality of side surfaces of the circuit board,
wherein the semiconductor light emitting element is mounted on the circuit board and is mechanically directly connected to the predetermined conductive pattern on the uppermost surface of the circuit board.

2. The light source module according to claim 1, wherein the circuit board includes a plurality of layers of substrates.

3. The light source module according to claim 1, wherein a thickness of the conductive pattern is 30 μm or more.

4. The light source module according to claim 1, wherein a recess portion is formed on the circuit board between the plurality of power supplying terminals.

5. A light source unit for a vehicle, the light source unit comprising:
a light source module; and
a heat radiating body having a heat absorbing face, wherein the light source module comprises:
a circuit board on which a predetermined conductive pattern is formed, wherein at least a portion of the conductive pattern is formed on an uppermost surface of an uppermost layer of the circuit board;
a semiconductor light emitting element mechanically directly connected to the conductive pattern; and
a plurality of power supplying terminals to which power cords for supplying electric power to the semiconductor light emitting element are connected,
wherein the circuit board includes a top surface as the uppermost surface of the uppermost layer, a bottom surface opposite the top surface, and a plurality of side surfaces connecting the top and bottom surfaces, and the circuit board is formed in a rectangular shape,
wherein each of the power supplying terminals is formed in a flat plate shape having a thickness that is smaller than a thickness of the circuit board;
wherein the uppermost surface of the uppermost layer of the circuit board is positioned higher than an upper face of each of the power supplying terminals, and
wherein an entire lower face of the circuit board as the bottom surface is electrically insulated, and is in contact with the heat absorbing face, the plurality of power supplying terminals is fixed onto the conductive pattern on the circuit board by welding, and the plurality of power supplying terminals protrudes from only one of the plurality of side surfaces of the circuit boards,
wherein the semiconductor light emitting element is mounted on the circuit board and is mechanically directly connected to the predetermined conductive pattern on the uppermost surface of the circuit board.

6. The light source unit according to claim 5, wherein the circuit board includes a plurality of layers of substrates.

7. The light source unit according to claim 5, wherein a thickness of the conductive pattern is 30 μm or more.

8. The light source unit according to claim 5, further comprising a clip that is operable to fix the light source module to the heat radiating body, wherein a recess portion is formed on the circuit board, and an engaging protrusion that is operable to engage with the recess portion is formed on the clip.

* * * * *